US009911871B1

(12) United States Patent
Lentine et al.

(10) Patent No.: US 9,911,871 B1
(45) Date of Patent: Mar. 6, 2018

(54) REFLECTIVE PHOTOVOLTAICS

(71) Applicant: Sandia Corporation, Albuquerque, NM (US)

(72) Inventors: Anthony L. Lentine, Albuquerque, NM (US); Gregory N. Nielson, Lehi, UT (US); Jose Luis Cruz-Campa, Albuquerque, NM (US); Murat Okandan, Edgewood, NM (US); Ronald S. Goeke, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 422 days.

(21) Appl. No.: 14/747,196

(22) Filed: Jun. 23, 2015

Related U.S. Application Data

(63) Continuation-in-part of application No. 14/067,822, filed on Oct. 30, 2013, now Pat. No. 9,496,448.

(60) Provisional application No. 62/016,823, filed on Jun. 25, 2014.

(51) Int. Cl.
| | |
|---|---|
| *H01L 31/052* | (2014.01) |
| *H01L 31/0216* | (2014.01) |
| *H01L 31/042* | (2014.01) |
| *H01L 31/18* | (2006.01) |

(52) U.S. Cl.
CPC ...... *H01L 31/02167* (2013.01); *H01L 31/042* (2013.01); *H01L 31/18* (2013.01)

(58) Field of Classification Search
CPC ... H01L 31/18; H01L 31/02; H01L 31/02168; H01L 31/0682; H01L 31/042
See application file for complete search history.

(56) References Cited

U.S. PATENT DOCUMENTS

| | | |
|---|---|---|
| 8,736,108 B1 | 5/2014 | Nielson et al. |
| 2009/0078316 A1 | 3/2009 | Khazeni et al. |
| 2009/0296194 A1 | 12/2009 | Gally et al. |
| 2012/0247541 A1 | 10/2012 | Wootton |
| 2014/0261624 A1 | 9/2014 | Cruz-Campa et al. |

FOREIGN PATENT DOCUMENTS

WO    2011-114262 A2    9/2011

OTHER PUBLICATIONS

International Search Report and Written Opinion for PCT/US2014/027670 filed on Mar. 14, 2014 mailed by the International Searching Authority dated Sep. 24, 2014 pp. 1-4.

*Primary Examiner* — Golam Mowla
(74) *Attorney, Agent, or Firm* — Martin I. Finston; Christopher N. Malvone

(57) ABSTRACT

A photovoltaic module includes colorized reflective photovoltaic cells that act as pixels. The colorized reflective photovoltaic cells are arranged so that reflections from the photovoltaic cells or pixels visually combine into an image on the photovoltaic module. The colorized photovoltaic cell or pixel is composed of a set of 100 to 256 base color sub-pixel reflective segments or sub-pixels. The color of each pixel is determined by the combination of base color sub-pixels forming the pixel. As a result, each pixel can have a wide variety of colors using a set of base colors, which are created, from sub-pixel reflective segments having standard film thicknesses.

16 Claims, 12 Drawing Sheets

SECTION A—A

DETAIL A

SECTION B-B

SECTION C-C

SECTION D-D

SECTION E-E

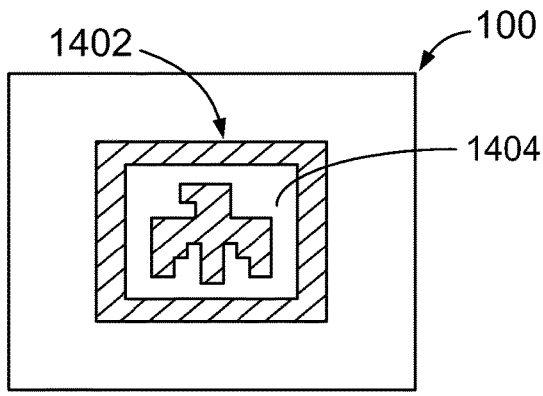
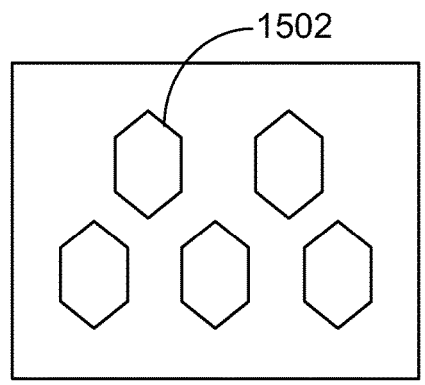
FIG. 14    FIG. 15
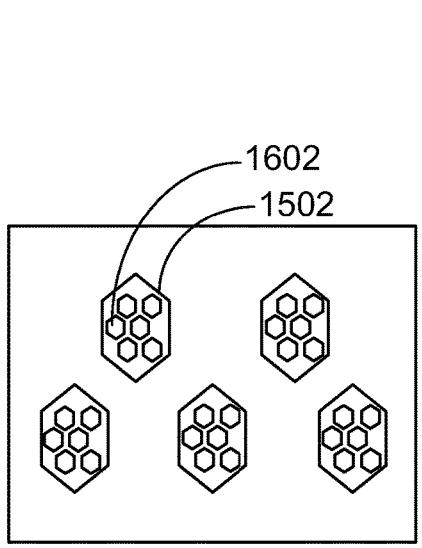
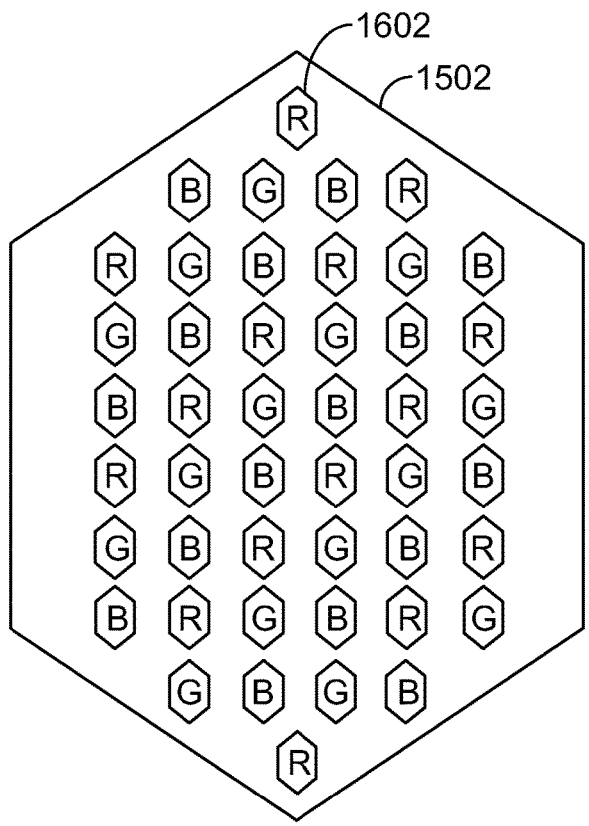
FIG. 16
FIG. 17

REFLECTIVE PHOTOVOLTAICS

CROSS-REFERENCE TO RELATED APPLICATIONS

This application claims the benefit of the earlier filing date of U.S. Provisional Patent Application No. 62/016,823, filed Jun. 25, 2014, entitled "REFLECTIVE PHOTOVOLTAICS". The aforementioned application is hereby incorporated by reference, in its entirety, for all purposes.

This application is a Continuation-In-Part of commonly assigned, co-pending U.S. patent application Ser. No. 14/067,822, filed on Oct. 30, 2013. The aforementioned application is hereby incorporated by reference, in its entirety, for all purposes.

GOVERNMENT RIGHTS

This invention was made with Government support under Contract No. DE-AC04-94AL85000 awarded by the U.S. Department of Energy. The Government has certain rights in the invention.

FIELD

The present invention relates in general to photovoltaic modules and in particular to colorized photovoltaic modules having miniaturized photovoltaic cells.

BACKGROUND

Traditional photovoltaic cells have been coated with antireflection coatings to minimize the reflectance of light incident on a cell surface. Accordingly, antireflection coatings are typically applied with an optical thickness to maximize absorption and conversion efficiency. As a result, traditional photovoltaic cells appear black or dark blue, due to the nearly complete absorption of incident light by the cells.

SUMMARY

In an embodiment of the present invention, a photovoltaic module includes reflective photovoltaic cells that act as pixels. The reflective photovoltaic cells are arranged wherein reflections from the photovoltaic cells or pixels visually combine into an image on the photovoltaic module. Each photovoltaic cell or pixel is composed of a set of 100 to 256 base color sub-pixel reflective segments or sub-pixels. The color of each pixel is determined by the combination of base color sub-pixels forming the pixel. As a result, each pixel can have a wide variety of colors using a set of base colors, which are created, from sub-pixel segments having standard film thicknesses.

In yet another embodiment of the present invention, a photovoltaic module includes colorized reflective photovoltaic cells that act as pixels and photovoltaic cells that act as background. The reflective photovoltaic cells are arranged wherein reflections from the photovoltaic cells or pixels visually combine into an image on the photovoltaic module. Colorized photovoltaic cells or pixels are composed of a set of 100 to 256 base color sub-pixel reflective segments or sub-pixels. The color of each pixel is determined by the combination of base color sub-pixels forming the pixel. As a result, each pixel can have a wide variety of colors using a set of base colors, which are created, from sub-pixel cells having standard film thicknesses. The background cells may be approximately the same size as the pixel cells and may or may not be colorized.

In still another embodiment the present invention provides a method of arranging photovoltaic cells to visually combine reflections into an image on a photovoltaic module. A first colorized photovoltaic cell is arranged to visually combine reflections into a first predetermined color using colored reflective segments, and a second colorized photovoltaic cell is arranged to visually combine reflections into a second predetermined color using colored reflective segments.

In another embodiment of the present invention, a photovoltaic module includes adjacent electricity generating devices, and at least one film layer covering the electricity generating devices. The film layer has reflective pixel segments and the reflective pixel segments have colored sub-pixel reflective segments. The colored sub-pixel reflective segments provide sub-pixel reflections that visually combine into a first predetermined color and the reflective pixel segments provide pixel reflections that visually combine into an image.

A photovoltaic cell having a device layer with a cell surface and a film with a film surface over the cell surface is described. The film may be configured to reflect a predetermined wavelength of visible light from the film surface and the cell surface in a direction away from the device layer. The film may include an optical thickness such that rays of the visible light reflected from the film surface and from the cell surface interfere constructively. Furthermore, the optical thickness of the film may vary such that the optical thickness at a first location of the film differs from a second optical thickness at a second location of the film. As a result, rays of a second predetermined wavelength of the visible light may reflect from the film surface and from the cell surface, and interfere constructively at the second location.

A photovoltaic module having a first set of photovoltaic cells and a second set of photovoltaic cells is also described. Each photovoltaic cell in the first set may include a first cell surface under a first film and each photovoltaic cell in the second set may include a second cell surface under a second film. Furthermore, the second film may differ from the first film such that the first set of photovoltaic cells and the second set of photovoltaic cells respectively reflect a first wavelength and a different second wavelength of visible light in a direction away from the photovoltaic module. For example, the first wavelength and the second wavelength may differ by at least 10 nm. The first set of photovoltaic cells may be horizontally spaced apart from the second set of photovoltaic cells on a plane of the photovoltaic module, forming an array of cells over the plane. Alternatively, the first set of photovoltaic cells may be stacked above the second set of photovoltaic cells out of a plane of the photovoltaic module, forming one or more multi-junction cells.

The photovoltaic module includes a receiving substrate with a support surface that supports the first set of photovoltaic cells and the second set of photovoltaic cells. Respective reflections from the first set of photovoltaic cells and the second set of photovoltaic cells may be visually combined into an image on the photovoltaic module. For example, the image may be a camouflage pattern on the photovoltaic module. Furthermore, the receiving substrate may be configured to flex.

BRIEF DESCRIPTION OF THE DRAWINGS

The invention may best be understood by referring to the following description and accompanying drawings that are used to illustrate embodiments of the invention. In the drawings:

FIG. 14 illustrates a pictorial view from a plurality of photovoltaic cells of a photovoltaic module;

FIG. 15 illustrates colorized photovoltaic cells from FIG. 14;

FIG. 16 illustrates colored sub-pixel reflective segments;

FIG. 17 illustrates colored sub-pixel reflective segments that form a colorized photovoltaic cell;

DETAILED DESCRIPTION

Figure 1:
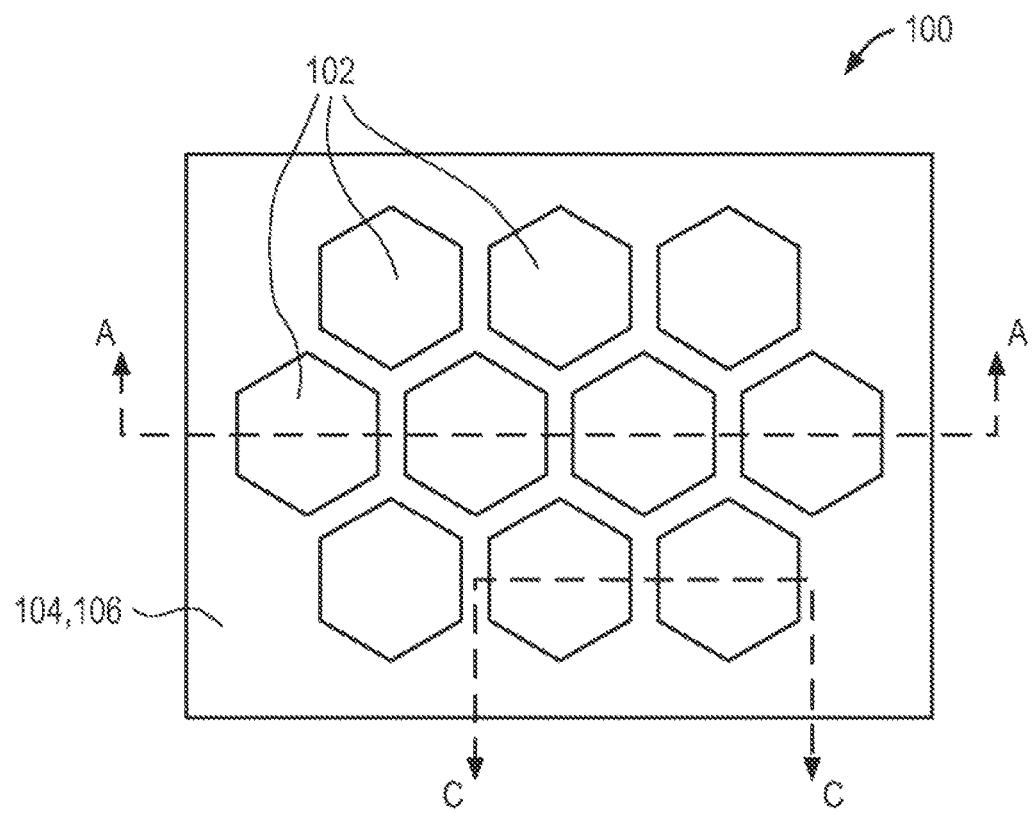
FIG. 1 is a top view of a photovoltaic module having a plurality of photovoltaic cells.

FIG. 1 illustrates a top view of a photovoltaic module having a plurality of photovoltaic cells. Photovoltaic module 100 includes one or more photovoltaic cells 102 supported on receiving substrate 104. More particularly, a plurality of photovoltaic cells 102 may be attached to receiving substrate 104 in an arrangement. For example, photovoltaic cells 102 may have a polygonal shape or any other shape. Photovoltaic cells 102 may have a hexagonal shape and may be arranged in a honeycomb pattern to cover an area of photovoltaic module 100.

Receiving substrate 104 may include a conductive material and/or may include a substantially flexible polymer. For example, receiving substrate 104 may have the structure and characteristics of a flexible circuit. That is, receiving substrate 104 may include a conductive circuit pattern affixed, coated with, and/or encapsulated within a flexible insulating polymer film. Accordingly, conductive circuitry of receiving substrate 104 may be electrically connected with one or more of photovoltaic cells 102. Alternatively, receiving substrate 104 may include a rigid material to stiffen photovoltaic module 100. Thus, receiving substrate 104 material may be selected according to the intended application of photovoltaic module 100.

Photovoltaic cells 102 may be electrically connected with the circuitry of receiving substrate 104 in numerous manners. For example, the underside of photovoltaic cells 102 may have conductive contacts such as solder bumps, conductive epoxy, or electroplated bumps comprising metal materials such as metal alloy, titanium or indium. The photovoltaic cells' conductive contacts may be bonded with electrical contacts of receiving substrate 104 circuitry using known techniques such as soldering.

Optionally, photovoltaic module 100 may further include a base substrate 106 structurally connected with receiving substrate 104. Base substrate 106 may be a flexible or rigid sheet of material, depending on the application. For example, base substrate 106 may be a thin sheet of polymer, elastomer, fabric, or any other material that is flexible and/or resilient. Alternatively, base substrate may be a structure formed from glass, metal, or any other material that is rigid and/or stiff. Base substrate 106 may provide structure to photovoltaic module 100 that compensates or complements the structure of receiving substrate 104. Thus, base substrate 106 may be sufficiently stiff to allow receiving substrate 104 to be formed solely from electrical wiring and/or elastic tape, yet still achieve acceptable overall structural integrity for the desired application. As an example, base substrate 106 may be rip-stop forming a wall of a tent, a jib of a sailboat or a poster panel for a billboard.

In the case of base substrate 106 being flexible, photovoltaic cells 102 may have a thickness of, for example, less than about 50 μm and preferably from about 5 μm to about 10 μm. As such, an overall thickness of photovoltaic module 100 remains small, for example, less than about 0.5 mm. More particularly, photovoltaic module 100 may have an overall thickness in a range of about 0.2 mm to about 0.4 mm. In addition, each of photovoltaic cells 102 may have profile dimensions of, for example, up to about 5 mm. More particularly, a lateral dimension of photovoltaic cell 102 may be about 1 mm or less. Smaller photovoltaic cell thicknesses and lateral dimensions, result in a smaller photovoltaic module bending radius.

In addition to its size, photovoltaic cell 102 may also include a shape that contributes to the overall flexibility of photovoltaic module 100. For example, photovoltaic cell 102 may include a polygonal shape (e.g. hexagonal or square) that allows for photovoltaic cells 102 to be tightly packed while maintaining spacing between them. This spacing may accommodate bending of photovoltaic module 100 in a variety of directions. For example, photovoltaic cells 102 may be arranged within photovoltaic module 100 in a side by side honeycomb like pattern such that each of the side walls of photovoltaic cells 102 may be juxtaposed with a sidewall of an adjacent photovoltaic cell as illustrated in FIG. 1. Since each of photovoltaic cells 102 may be independently attached to receiving substrate 104 and may have length and width dimensions of less than 1 mm, photovoltaic module 100 may flex or bend at multiple points around and between photovoltaic cells 102 without causing contact between photovoltaic cells 102.

Although a flexible photovoltaic module 100 is described, photovoltaic module 100 may be a substantially rigid structure. For example, where photovoltaic cells 102 are attached to a rigid receiving substrate 104 or base substrate 106, photovoltaic module 100 may form a rigid module structure. Furthermore, additional stiffening structures such as ribbing or epoxy films may be used to further stiffen an originally flexible photovoltaic module.

Figure 2:
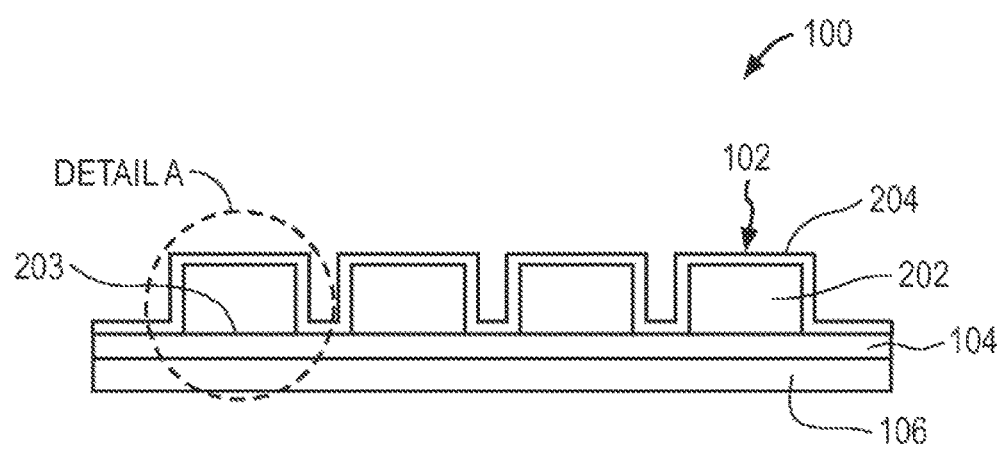
FIG. 2 is a section view, taken about line A-A of FIG. 1, of a plurality of photovoltaic cells on a receiving substrate of a photovoltaic.

Referring to FIG. 2, a section view is shown taken about line A-A of FIG. 1, of a plurality of photovoltaic cells on a receiving substrate of a photovoltaic module. Each photovoltaic cell 102 may be supported on a support surface 203 of receiving substrate 104. For example, a device layer 202 of photovoltaic cell 102 may be fixed to support surface 203. Device layer 202 is at least partially covered by a film 204. As used here, device layer 202 generally refers to a portion of photovoltaic cell 102 that receives incident light through film 204. That is, device layer 202 may include a portion of photovoltaic cell 102 that converts energy from absorbed light into electricity using the photovoltaic effect. Thus, device layer 202 may have numerous physical configurations and be formed from various materials known in the art.

Figure 3:
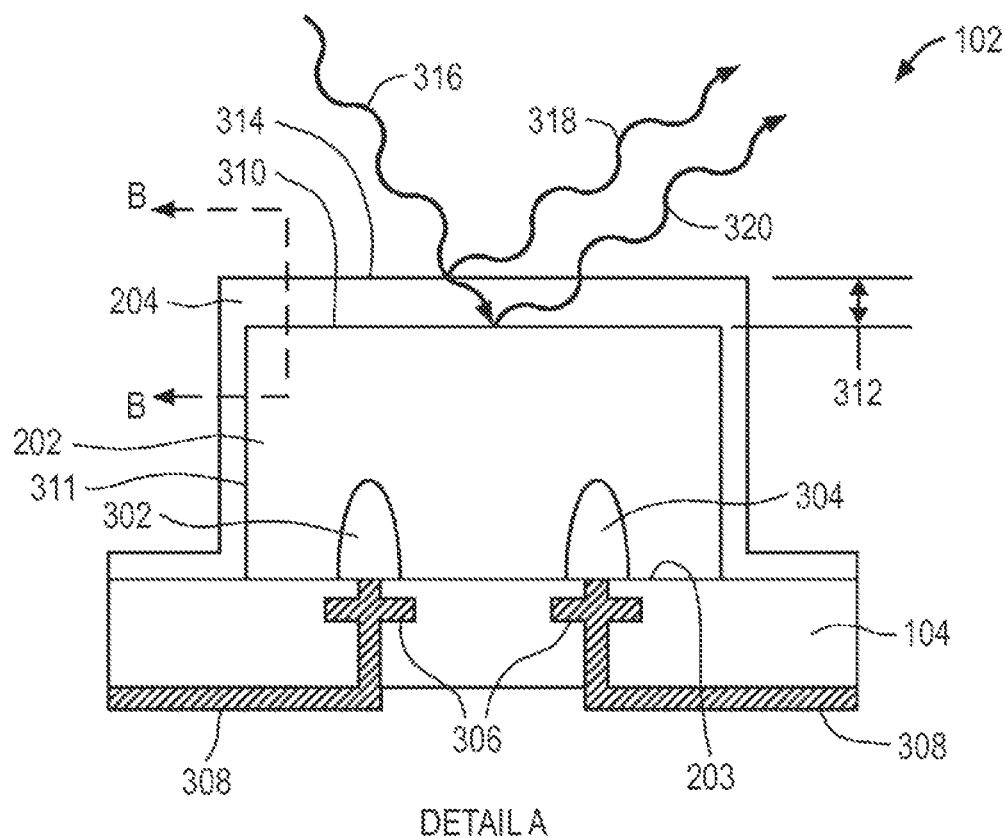
FIG. 3 is a detail view, taken from Detail A of FIG. 2, of a photovoltaic cell having a film.

Referring to FIG. 3, a detail view is shown taken from Detail A of FIG. 2, of a photovoltaic cell. Device layer 202 includes a bulk material such as monocrystalline silicon, polycrystalline silicon, amorphous silicon, cadmium telluride, gallium arsenide, indium phosphide, or copper indium selenide/sulfide, to name a few. Device layer 202 may also include semiconductor junction regions formed in the bulk material, such as p-type region 302 and n-type region 304. As an example for a silicon cell, p-type region 302 may include boron or gallium, and n-type region 304 may include phosphorous or arsenic. Accordingly, semiconductor junction regions may be formed using known implant-based techniques, such as consecutively applying p+ implants and n+ implants through openings in a photoresist layer. Alternatively, non-implant based approaches may be used to create p-type region 302 and n-type regions 304, such as dopant diffusion processes.

In the example of FIG. 3, p-type region 302 and n-type region 304 are electrically connected to electrical contacts 306. Electrical contacts 306 may be associated with receiving substrate 104, or may be separately formed from receiving substrate 104. For example, electrical contacts 306 may be solder bumps or aluminum paste annealed over semiconductor junction regions. Electrical contacts 306 may further be placed in electrical connection with electrical leads 308. For example, electrical leads 308 may be circuitry of receiving substrate 104 that interconnect with power equipment, such as a power inverter. Thus, electricity generated in device layer 202 may be harvested through electrical leads 308 of photovoltaic module 100.

Film 204 may be applied over a cell surface 310 of device layer 202. More specifically, film 204 may be applied over an entire cell surface 310 and side wall 311 of device layer 202, or alternatively, film 204 may be applied over only a portion of cell surface 310. Film 204 may be formed over cell surface 310 using deposition techniques. For example, film 204 may be deposited by sputtering, atomic layer deposition, electron beam evaporation or chemical vapor deposition. Film 204 is deposited over cell surface 310 to a film thickness 312. Film thickness 312 may be defined by a distance between cell surface 310 and a film surface 314. Film thickness 312 may be a length orthogonally between cell surface 310 and film surface 314. Film thickness 312 may be controlled during the selected deposition process, for example, by controlling timing of deposition. Thickness of film 204 may also be measured during deposition to ensure that a desired thickness is achieved. Thus, films may be controllably applied using known processes and process controls.

Film 204 may be formed from numerous optical materials. For example, film 204 may be formed from various nitrides or oxides. Film 204 may include either silicon nitride ($Si_3N_4$) or silicon dioxide ($SiO_2$); however, other materials may be suitable to form film 204, including a variety of transparent dielectric materials such as alumina, magnesium fluoride or diamond-like carbon. Furthermore, exotic methods such as nanostructured films, self-assembled microspheres, and organic materials, may be used to form film 204 over cell surface 310. Additionally, film 204 may also include a semiconductor material.

In an embodiment, film 204 material may be chosen based on a refractive index value of the material. In particular, a film material may be selected that has an index value between the refractive index values of the surrounding medium, for example air, and device layer 202, for example silicon. An index value in this range may provide for the reflection of light from both film surface 314 and cell surface 310. Accordingly, a refractive index of film 204 may be in a range of about 1.0 to 6.5 for the transmission of light across the visible spectrum. For example, refractive index for film 204 of silicon nitride transmitting light spanning the visible spectrum may be between about 2.01 to 2.09. Alternatively, the refractive index for film 204 of silicon dioxide transmitting light across the visible spectrum may be in a range of about 1.45 to 1.47.

As described below, film 204 may have one or more layers formed from similar or different materials. Each layer may include a similar or different optical thickness. As used here, optical thickness refers to an optical path length or optical distance of a film or a film layer. More specifically, optical thickness is a product between a refractive index of a film and a dimensional thickness of the film. For example, in the case of two films, one formed from silicon nitride and one formed from silicon dioxide, a dimensional thickness of the films to ensure that light of the same wavelength that is coherent before entering the films will also be in phase when exiting the films, is the ratio between the refractive indices of the materials. That is, the thickness of the silicon dioxide film must be about 1.4 times thicker than the thickness of the silicon nitride film to ensure that transmitted light rays of the same wavelength entering the films will remain in phase when exiting the films.

Reflection of a ray of light from a film depends on optical thickness. More particularly, for two light rays of a like wavelength to constructively interfere and reflect from film 204, the rays must be in phase as they exit film surface 314. Thus, for constructive interference between a front-surface-reflected ray and a back-surface reflected ray that are in phase when they impinge the front surface, the difference in optical thickness traversed by the respective rays must equal one or more full wavelengths. This condition is satisfied if the dimensional thickness of the film equals one or more integer numbers of (vacuum) half-wavelengths, divided by the refractive index of the film. Generally, a film thickness corresponding to a single half-wavelength will be typical. As an example, for film of silicon nitride having a refractive index of 2.09 when transmitting light with a wavelength of 380 nm, a dimensional thickness of the film will be a half wavelength (190 nm) divided by the refractive index (2.09), or about 91 nm, to ensure that the incident light constructively interferes at the film surface. From the discussion above, it is apparent that constructive interference and reflectance of light from a film depends in part on optical thickness, and optical thickness may be controlled not only through the choice of material with a particular refractive index, but also through the dimensional thickness of the film and/or film layers.

FIG. 3 illustrates that ray 316 is reflected due to constructive interference between rays 318 and 320, and that while this may be true for rays of certain wavelengths, it is to be noted that in typical applications the incident light will be sunlight, which has a broad spectrum. In broad-spectrum applications, from an onlooker's perspective this will result in the photovoltaic cell having a color associated with the reflected wavelength.

Figure 4:
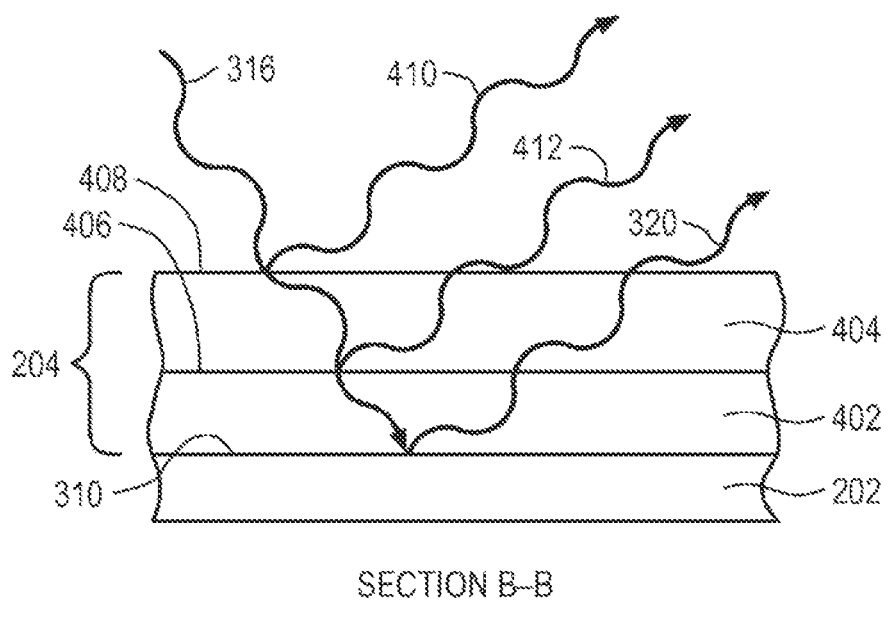
FIG. 4 is a section view, taken about line B-B of FIG. 3, of a film portion of a photovoltaic cell.

Referring to FIG. 4, a section view is shown, taken about line B-B of FIG. 3, of a film portion of a photovoltaic cell. Film 204 includes multiple layers. For example, film 204 may include a bottom film layer 402 deposited over cell surface 310 of device layer 202. Furthermore, film 204 may include a top film layer 404 deposited over bottom film surface 406 of bottom film layer 402. Accordingly, incident light 316 directed toward device layer 202 passes through top film surface 408, bottom film surface 406 and cell surface 310 before entering a bulk material of device layer 202 to be converted into electricity. Furthermore, as broad spectrum incident light 316 passes through film 204, a top film ray 410 reflects from top film surface 408, a bottom film ray 412 reflects from bottom film surface 406, and cell ray 320 reflects from cell surface 310. Accordingly, top film ray 410, bottom film ray 412, and cell ray 320 may propagate in the same direction away from device layer 202.

Rays 410 and 412 schematically illustrate the possibility of combining reflections from multiple film layers. Combinations of reflected light from a single photovoltaic cell may be exploited through the addition of more and different layers of film 204, which provides for control over the types and intensities of reflected visible light wavelengths.

In reference to FIGS. 3 and 4, film ray 318 and cell ray 320 may respectively reflect from film surface 314 and cell surface 310 out of phase with each other, and thus, the rays may destructively interfere such that little or no resultant light ray of the given wavelength is reflected from photovoltaic cell 102. As explained above, whether film ray 318 and cell ray 320 will be in phase or out of phase may be determined by an optical thickness of film 204. The reflection of a resultant light ray of a given wavelength may be controlled by controlling optical thickness of film 204 and/or film 204 layers. More specifically, the reflection of a color from photovoltaic cell 102 may be controlled by adjusting a material and/or film thickness 312 for each layer in film 204.

FIGS. 3 and 4 illustrate a simplified model of constructive interference. The amplitudes of reflected light will depend on the extent to which the condition for constructive interference is satisfied, and this will be different for different wavelengths. Hence when the incident light is broad-spectrum light, the spectral content of the reflection will depend on both the incident spectrum and on the details of the film configuration. One consequence is that different film configurations can produce different perceived colors.

Figure 5:
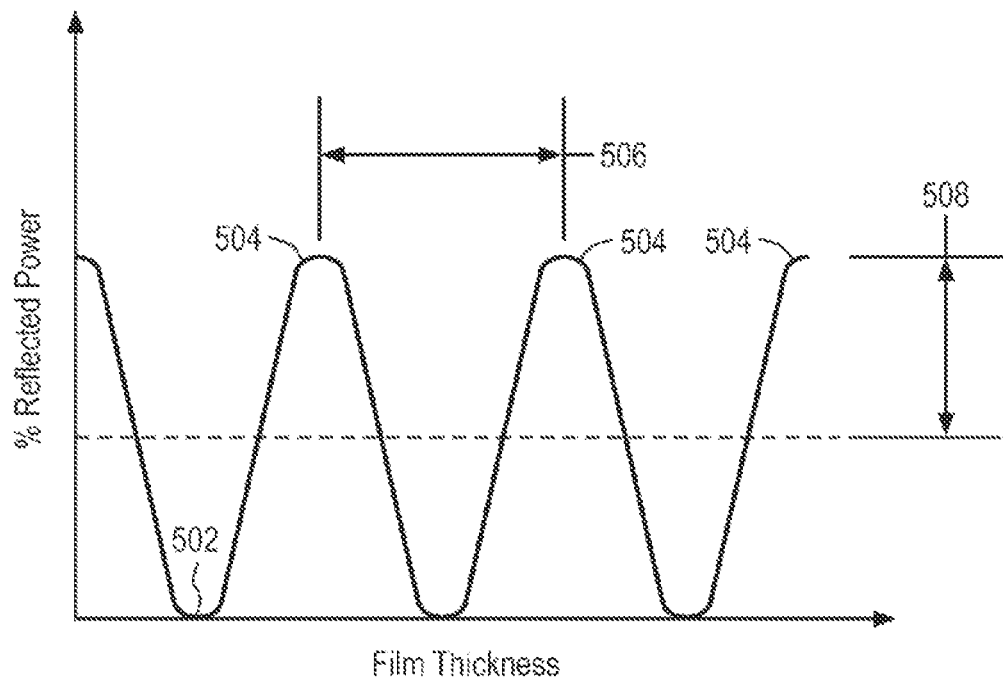
FIG. 5 is a graph illustrating power loss versus film thickness for a photovoltaic cell.

Referring to FIG. 5, a graph illustrating power loss versus film thickness for a photovoltaic cell is shown. The example is provided for a single layer film, but one skilled in the art may extrapolate the discussion below to multi-layered films also. As film thickness 312 increases from zero, reflected power decreases from a maximum to a minimum at a first dark fringe 502. There is a reflection minimum for the pertinent wavelength at the film thicknesses corresponding to the dark fringes. This first dark fringe 502 represents a film thickness 312 at which reflection losses from device layer 202 are minimal, i.e., a point of maximum solar energy conversion for a cell. Thus, for traditional solar cells, film thickness 312 at dark fringe 502 may represent a preferred option. Film thickness 312 at the first dark fringe 502 may vary based on the material used for a film and the number of layers in film 204. As an example, for a device layer 202 formed from silicon and a single film layer formed from silicon nitride (refractive index of about 2.04 at 535 nm), the first dark fringe 502 for an incident wavelength of light of 535 nm occurs with a film 204 having an optical thickness of a quarter wavelength in the material, i.e., corresponding to a film thickness 312 of approximately 65 nm. In fact, for the same solar cell over the entire spectrum of visible light, the first dark fringe 502 may occur with film thicknesses 312 ranging from about 44 nm to 93 nm. However, in an embodiment, film thickness 312 may be chosen to be between about 65 nm to 75 nm in order to take advantage of a dark fringe 502 near the middle range of the visible spectrum.

As mentioned above, the first dark fringe 502 may correspond to different film thicknesses 312 where multiple film layers are employed. For example, in a case in which device layer 202 is formed from silicon and a two-layer film 204 is employed having a silicon dioxide top film layer 404 (refractive index of about 1.46 at 535 nm) and a silicon nitride bottom film layer 402 (refractive index of about 2.04 at 535 nm), a dark fringe 502 for an incident wavelength of light of 535 nm occurs with a top film layer thickness and a bottom film layer thickness corresponding to an optical thickness of a quarter wavelength each. Accordingly, a dark fringe 502 occurs with a top film layer thickness of approximately 91 nm and a bottom film layer thickness of approximately 65 nm. With multiple layers 402 and 404, and hence two or more interfaces, there is sufficient control to create two minima. More layers may be employed to create even more dark fringes centered at different wavelengths.

As film thickness 312 increases beyond the optical thickness associated with dark fringe 502 for a given wavelength, percent power reflected for that wavelength increases. More specifically, as film thickness 312 increases so does the path length over which cell ray 320 travels, causing film ray 318 and cell ray 320 to shift back into phase until a maximum at bright fringe 504 is achieved. For the pertinent wavelength, a reflection maximum occurs at each film thickness corresponding to one of these bright fringes. At bright fringe 504, film ray 318 and cell ray 320 are in phase and combine to reflect away from device layer 202. Accordingly, energy of film ray 318 and cell ray 320 are lost as reflected visible light and the power absorption of device layer 202 decreases as compared to absorption at dark fringe 502. As an example, for a device layer 202 formed from silicon and a single layer film 204 formed from silicon nitride, bright fringe 504 may occur over the entire spectrum of visible light with film thickness 312 ranging from about 88 nm to 186 nm.

In an embodiment, for a photovoltaic cell 102 having a single layer film 204, dark fringe 502 and bright fringe 504 for a given wavelength repeat in a sinusoidal manner with intermittent maxima occurring at fringe spacing 506. More specifically, fringe spacing 506 corresponds with half of the wavelength of the impinging light ray, given that for every increase in film thickness 312 by one half wavelength, the optical path length travelled by cell ray 320 may be a full wavelength, and thus, the film ray 318 and cell ray 320 interference may repeat. Accordingly, for longer wavelength light, for example, red light, fringe spacing 506 is greater than for shorter wavelength light, for example, violet light.

Figure 6:
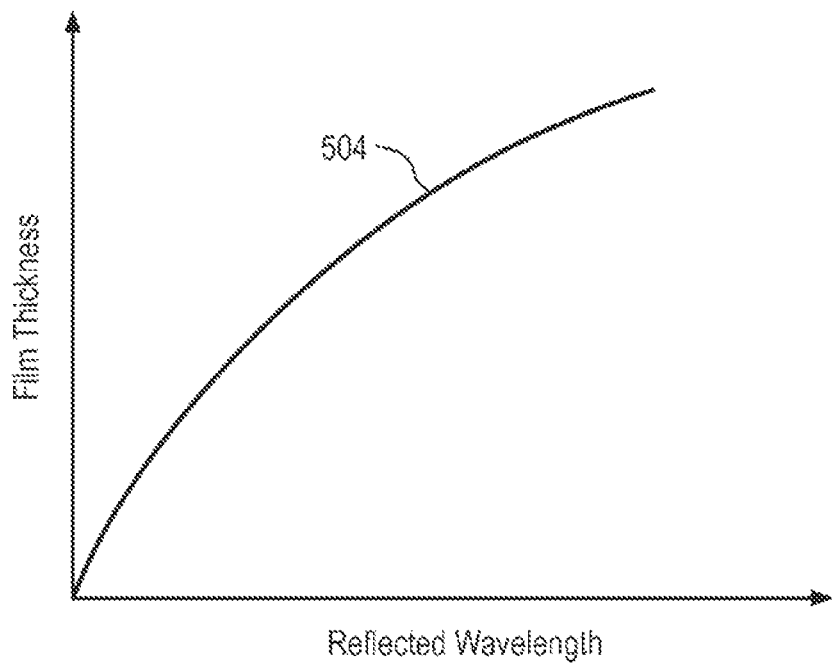
FIG. 6 is a graph illustrating film thickness to obtain a bright fringe for reflecting various wavelengths of visible light from a photovoltaic cell.

Referring to FIG. 6, a graph illustrating film thickness to obtain a bright fringe for reflecting various wavelengths of visible light from a photovoltaic cell is shown. Based on the above description, in order to ensure that a given wavelength of light is reflected from photovoltaic cell 102, film 204 may be deposited in a configuration corresponding to bright fringe 504 for that wavelength. As an example, photovoltaic cell 102 with silicon device layer 202 and single layer film 204 of silicon nitride may include film thickness 312 of between about 88 nm to 186 nm to ensure that at least one wavelength of light across the visible spectrum constructively interferes and is selectively reflected away from photovoltaic cell 102. Thus, film configuration may be manipulated to selectively reflect a given wavelength of light such that the cell appears to have a predetermined color. More particularly, optical thickness of film 204 may be controlled such that photovoltaic cell 102 reflects a wavelength of light greater than 380 nm, greater than 450 nm, greater than 570 nm, greater than 590 nm, and/or greater than 620 nm, corresponding to the visible spectrum of light.

Film configuration may be manipulated in numerous ways to achieve the desired selective reflectance and photovoltaic cell color. For example, silicon device layer 202 may be covered by a silicon nitride film 204, film thickness 312 may be deposited to a thickness greater than a film thickness corresponding to dark fringe 502 for a given wavelength. More specifically, film thickness 312 may be deposited to achieve an optical thickness of at least a quarter wavelength of the selected colored light wavelength and more preferably at least three-eighths of the wavelength of the selected colored light. Further still, film thickness 312 may be varied to achieve an optical thickness of film 204 in a range between even multiples of three-eighths to five-eighths of a wavelength corresponding to the selected color. Such a range corresponds to constructive region 508 in which rays tend to mostly interfere constructively. For example, a second bright fringe 504 for a wavelength may be centered within constructive region 508 between optical thicknesses of film 204 ranging from six-eighths to ten-eighths, and more particularly between optical thicknesses ranging from seven-eighths to nine-eighths of the wavelength corresponding to the selected color. Thus, film thickness 312 may be configured to include an optical thickness within constructive region 508 in order to take advantage of second bright fringe 504, or other higher order bright fringes, and to reflect the wavelength of light in that range.

In another example, film thickness 312 is deposited to a thickness corresponding to bright fringe 504 for the desired wavelength of light. More specifically, for a photovoltaic cell 102 having silicon device layer 202 and single layer film 204 of silicon nitride, in order to reflect a green color, film 204 may be deposited to achieve an optical thickness of about half of the wavelength of the selected green colored light. For example, film 204 may be deposited to a thickness of about 130 nm to reflect green light with a wavelength of about 530 nm and thus color photovoltaic cell 102 green.

From the discussion above, it will be apparent that optimal film thickness 312 is variable, depending on the color sought, film material, number of layers, etc. However, in exemplary embodiments using a single interference film layer 204 of silicon nitride, total destructive interference is achieved for violet light at a film thickness 312 of about 75 nm, for blue at about 100 nm, for green at about 125 nm, and for yellow at about 200 nm. Hence to produce reflection at a selected one of these colors, thickness 312 should exceed the respective stated value.

In addition to a minimum film thickness 312 to achieve a photovoltaic cell 102 color, film thickness 312 may also be selected based on different power generation efficiencies centered around different bright fringes 504. More particularly, a photovoltaic cell 102 may appear of a certain color when film 204 is applied to a thickness corresponding to one of the bright fringes 504 associated with the color. For example, photovoltaic cell 102 may appear to be colored a similar shade of green when single layer film 204 includes an optical thickness of 130 nm, 260 nm, 390 nm, and so on, corresponding to each bright fringe 504 shown in FIG. 5. However, even though cell color may be similar, the overall power efficiency of photovoltaic cell 102 with film thickness of 390 nm may differ as compared to the overall power efficiency of photovoltaic cell 102 with film thickness of 130 nm. This may be the case, for example, because reflectance of other wavelengths may be minimized at a higher order bright fringe as compared to other bright fringes for a selected wavelength or associated color. Thus, a designer wanting a green photovoltaic cell 102 may choose a film thickness corresponding to a bright fringe 504 at which overall power efficiency for the colorized photovoltaic cell 102 is highest, even if the chosen thickness is more costly to apply.

The discussion above primarily assumes a normal or perpendicular angle of incidence of a light ray entering film 204. However, in practice, this idealization may not be the case. For viewing at an oblique angle, the optical path length through the film increases by a factor of the secant of the angle of view, as taken relative to the normal. Nonetheless, one skilled in the art may adjust for oblique or non-perpendicular viewing angles through variations in film thickness 312. For example, if an onlooker is expected to view photovoltaic module 100 at an angle of 45 degrees, film thickness 312 may be expected to decrease approximately by the cosine of 45 degrees times a half wavelength of the incident light 316. That is, for a same color appearance of photovoltaic module 100, film thickness 312 may be decreased by about 30% as compared to film thickness 312 when onlooker is expected to view photovoltaic module 100 perpendicularly. These adjustments are derivable by one skilled in the art and may be exploited to ensure that the desired color is reflected in the desired direction from photovoltaic cells 102 that are placed on curved surfaces.

For example, photovoltaic cells 102 covering a curved parabolic reflector may include different film thickness 312. More particularly, film thickness 312 of photovoltaic cells 102 near the center of the reflector may be thicker than film thickness 312 of photovoltaic cells 102 near an outer edge of the reflector, when an onlooker is expected to view the center of the reflector straight on. As a result, the entire curved surface may appear to have approximately the same color to the onlooker, even though the optical thicknesses of the photovoltaic cells 102 across the photovoltaic module 100 differ for the different angles of incidence.

Figure 7:
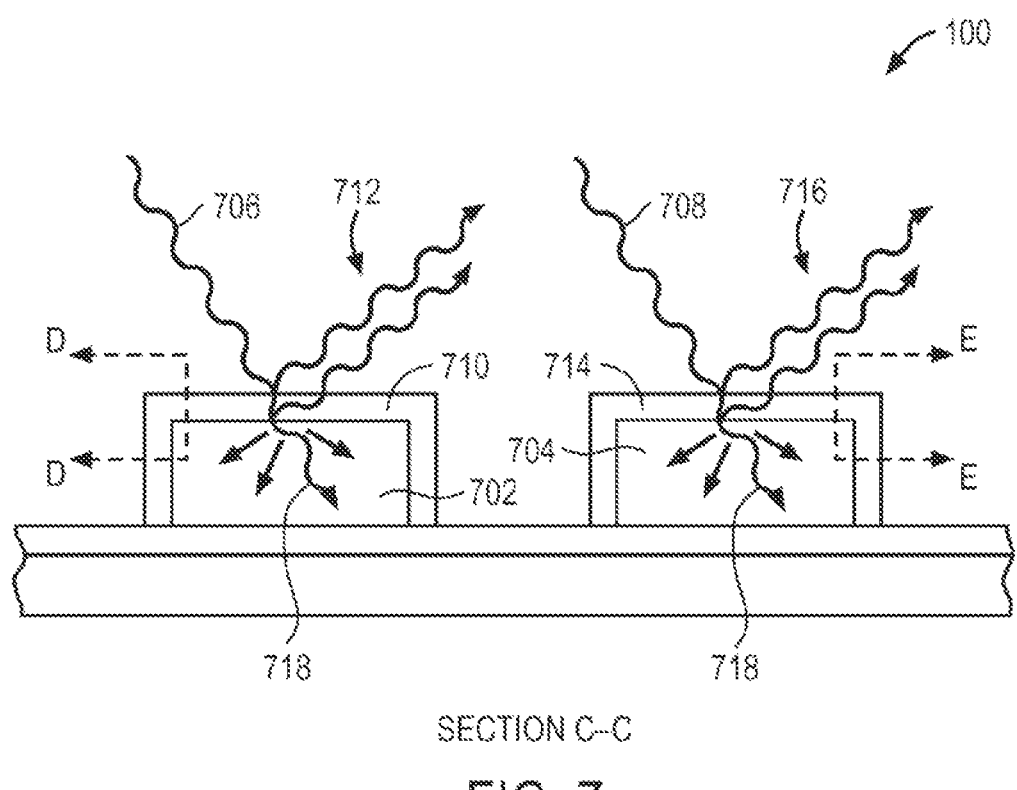
FIG. 7 is a section view, taken about line C-C of FIG. 1, of a plurality of photovoltaic cells having different films.

Referring to FIG. 7, a section view is shown, taken about line C-C of FIG. 1, of a plurality of photovoltaic cells having different films. Selective coloring of photovoltaic cells based on film selection may be applied to a plurality of photovoltaic cells 102 in a photovoltaic module 100 in order to achieve a desired overall appearance and aesthetic of the photovoltaic module 100. First photovoltaic cell 702 and a second photovoltaic cell 704 of photovoltaic module 100 are illuminated by incident light 316. More specifically, a broad spectrum incident light 316 having a first incident light 706 of a first wavelength and a second incident light 708 of a second wavelength is directed to the photovoltaic module 100. First film 710 of first photovoltaic cell 702 may be configured in a manner described above to selectively reflect first reflection 712 of a first wavelength of visible light away from first photovoltaic cell 702, while second film 714 of second photovoltaic cell 704 may be configured to reflect second reflection 716 of a second wavelength of visible light away from second photovoltaic cell 704.

For example, the first wavelength and the second wavelength may be the same, and thus, first photovoltaic cell 702 and second photovoltaic cell 704 may have a similar color appearance. However, alternatively, the first wavelength and the second wavelength may differ, resulting in differently colored photovoltaic cells. For example, the first wavelength may differ from the second wavelength by at least 10 nm, creating a perceptible change in color hue, even where the photovoltaic cells are in the same color range. In another example, the first wavelength and the second wavelength differ by more than about 30 nm.

Thus, when viewed from the same direction, photovoltaic module 100 may appear to have two differently colored pixels, that is, first photovoltaic cell 702 and second photovoltaic cell 704 arranged as pixels in a display. Wavelengths of light in incident light 316 not reflected by either of the photovoltaic cells may be absorbed by the photovoltaic cells for the creation of electricity.

Figure 8:
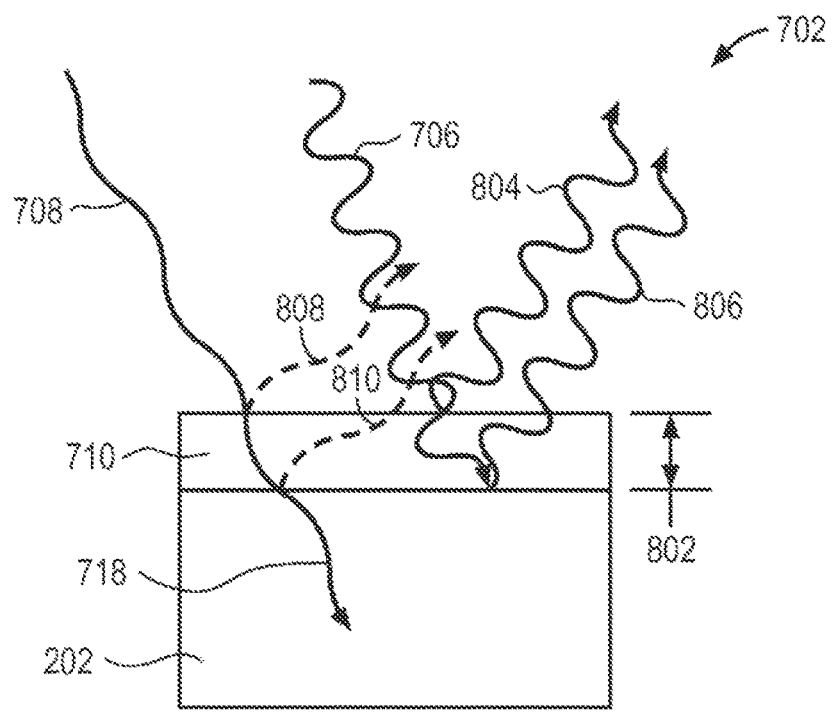
FIG. 8 is a section view, taken about line D-D of FIG. 7, of a photovoltaic cell having a first film.

Referring to FIG. 8, a section view is shown, taken about line D-D of FIG. 7, of a first photovoltaic cell. First film 710 is deposited over device layer 202 in a configuration to selectively reflect first incident light 706 away from first photovoltaic cell 702. For example, first incident light 706 may be red light with a wavelength of about 700 nm. As described above, in a case of a single layer film 204 of silicon nitride over a silicon device layer 202, first film thickness 802 may be varied such that the optical thickness of film 204 is a half wavelength of the red light to cause the red light to constructively interfere and reflect away from first photovoltaic cell 702. Thus, since silicon nitride has a refractive index of about 2.02 at the desired wavelength, first film thickness 802 may be deposited to about 174 nm to cause constructive film ray 804 and constructive cell ray 806 to combine and reflect away from device layer 202, giving first photovoltaic cell 702 a reddish color.

First photovoltaic cell 702 may be selectively colored by altering first film 710 to reflect away certain wavelengths of light, and similarly, it may be selectively receptive to other wavelengths of light. For example, second incident light 708 may correspond to yellow light with a wavelength of about 580 nm. Thus, in the example described above in which first photovoltaic cell 702 is manipulated to appear red, first film 710 of silicon nitride with a thickness of about 174 nm will have an optical thickness of about three-fifths of the yellow light wavelength. Accordingly, destructive film ray 808 and destructive cell ray 810 of second incident light 708 will substantially destructively interfere, and thus, most of yellow light will become absorbed light 718 within device layer 202, rather than being reflected away to alter the color of first photovoltaic cell 702.

Figure 9:
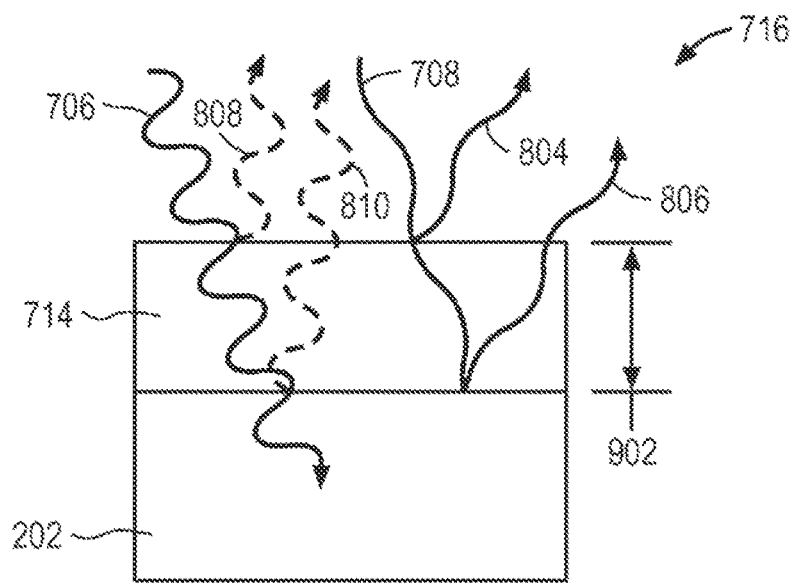
FIG. 9 is a section view, taken about line E-E of FIG. 7, of a photovoltaic cell having a second film.

Referring to FIG. 9, a section view is shown, taken about line E-E of FIG. 7, of a second photovoltaic cell. In this example, second photovoltaic cell 704 is configured to preferentially reflect second incident light 708 while substantially absorbing first incident light 706. Second film 714 may include a single layer of silicon dioxide over a silicon device layer 202. Second film thickness 902 may be deposited to achieve an optical thickness of a half wavelength of second incident light 708. For example, where second incident light 708 corresponds to yellow light with a wavelength of about 580 nm, second film thickness 902 with a refractive index of about 1.46 at the desired wavelength may be approximately 142 nm to cause constructive film ray 804 and constructive cell ray 806 to constructively interfere and reflect away from device layer 202, giving second photovoltaic cell 704 a yellowish color.

Second photovoltaic cell 704 may also be selectively receptive to other wavelengths of incident light 316, such as first incident light 706. In an example in which first incident light 706 is red light with a wavelength of 700 nm, second film 714 with a thickness of 198 nm will have an optical thickness of about two-fifths of the red light wavelength. Accordingly, destructive film ray 808 and destructive cell ray 810 of first incident light 706 will substantially destructively interfere, and thus, most of red light will become absorbed light 718 within device layer 202, rather than being reflected away to alter the appearance of second photovoltaic cell 704.

An optical thickness across a film may be varied to cause multiple visible reflections to emanate from the same film surface. For example, the optical thickness at a first location on a film may be greater than an optical thickness at a second location on the film. Thus, as incident light passes through the film, a first wavelength of light will constructively interfere at the first location and a second wavelength of light will constructively interfere at the second location. Accordingly, the first wavelength of light will reflect from the first location and the second wavelength of light will reflect from the second location. Therefore, the visible color of a photovoltaic cell may be altered across the cell surface by closely controlling optical thickness of a film over the cell surface. This phenomenon may be used, for example, to give a single photovoltaic cell surface an iridescent visible appearance.

Figure 10:
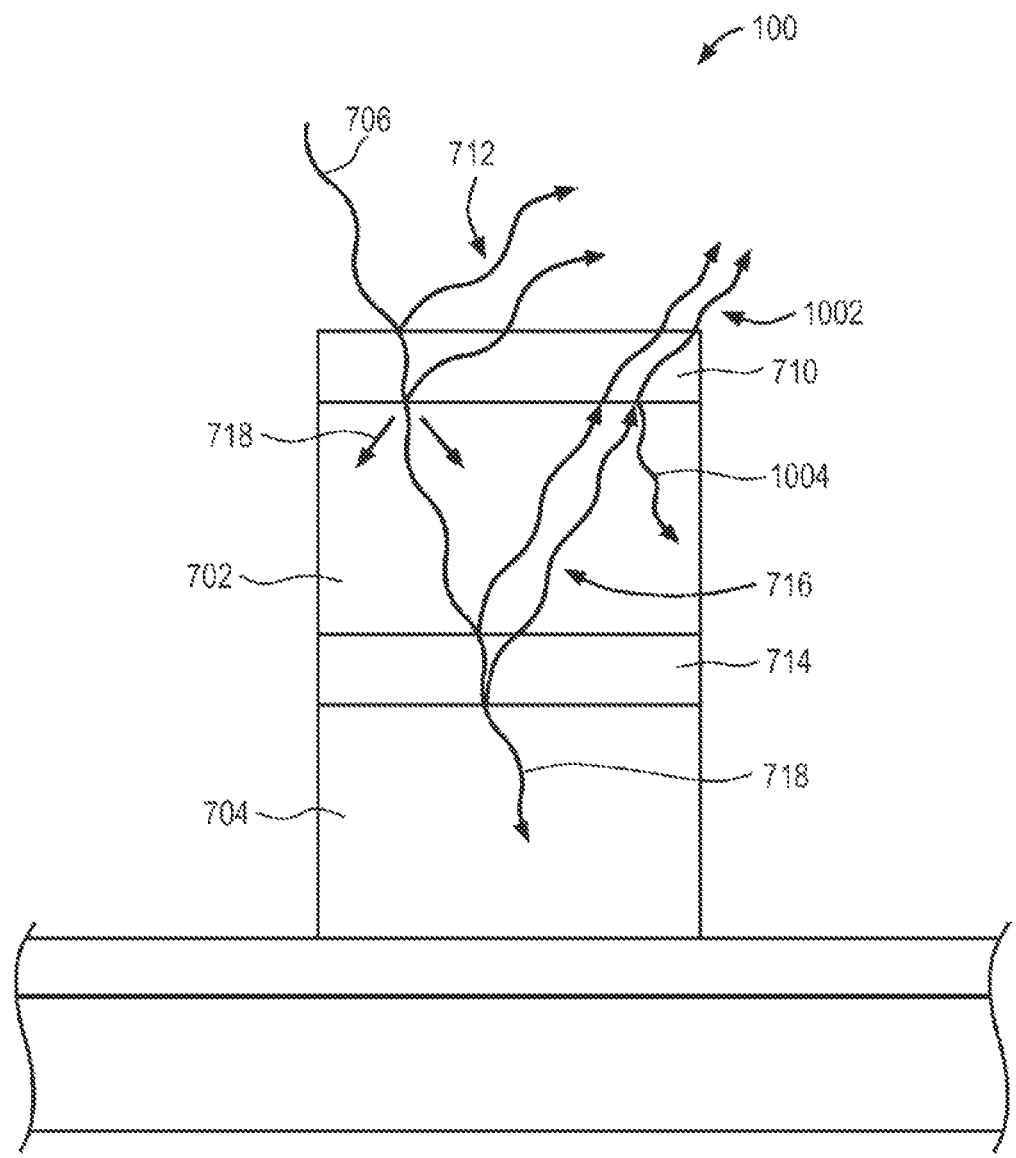
FIG. 10 is a section view of a plurality of photovoltaic cells in a stacked configuration and having different films.

FIG. 10 illustrates a section view of a plurality of photovoltaic cells in a stacked configuration and having different films. Multiple photovoltaic cells 704 with different reflective properties may be arranged in-plane relative to each other; as illustrated in FIG. 7, for example, they are separated horizontally from each other on a plane of photovoltaic module 100. Additionally, a plurality of photovoltaic cells 704 may also be separated vertically from each other. For example, mechanically stacked photovoltaic cell designs may be used in microsystems enable photovoltaics (MEPV).

In this example, a multi junction cell includes first photovoltaic cell 702 stacked above second photovoltaic cell 704. Thus, the stack of photovoltaic cells may project out of a plane of photovoltaic module 100. First photovoltaic cell 702 may include first film 710 and second photovoltaic cell 704 may include second film 714. Thus, first film 710 may be above both first photovoltaic cell 702 and second photovoltaic cell 704, while second film 714 may be sandwiched between first photovoltaic cell 702 and second photovoltaic cell 704. Optionally, second film 714 may function as a glue layer to adhere the photovoltaic cells together, or in another embodiment, a separate junction film may be applied to bond the photovoltaic cells into a stacked configuration. The cells may be nominally isolated electrically and interconnected using various interconnection architectures, as described further below.

Incident light 706 may pass through first film 710 to be partially reflected as first visible reflection 712 and partially absorbed as absorbed light 718. Absorbed light 718 may also travel through first photovoltaic cell 702 toward second photovoltaic cell 704. More specifically, absorbed light 718 is not only partially absorbed by first photovoltaic cell 702, but portions may also reflect from sandwiched second film 714 as second reflection 716, and still other portions may enter second photovoltaic cell 704 to become absorbed light 718 therein.

Unlike FIG. 7, in which reflected light 712 and 716 may be independently optimized and spatially separated, reflected light from first film 710 and second film 714 in a stacked cell configuration is not independent from each other. This phenomenon is due to the multiple partial reflections that can occur between layers. For example, portions of reflected light 716 emanate away from the stacked multi junction cell as visible light 1002, but still other portions are reflected from a lower surface of first film 710 back toward second film 714 as partial internal reflection 1004. Partial reflection 1004 may further enter second photovoltaic cell 704 as absorbed light 718.

Although the presence of internal reflections and the combinations of internal reflections with absorbed light may complicate the photovoltaic cell model, the design of a multi junction cell may nonetheless be performed using well known optical design techniques. For example, a structure such as this may be referred to as a multilayer dielectric stack, for which design tools exist to optimize reflections. Thus, first film 710 and second film 714 may be optimized to achieve the desired visible reflections 712 and 716 over the optical spectrum of interest. A spatial variation of first film 710 may allow a spatial dependence of reflection across the stacked photovoltaic cell 704. Furthermore, multiple stacked photovoltaic cells 704 may be arranged in-plane across photovoltaic module 100 as described above with respect to FIG. 7.

Figure 11:
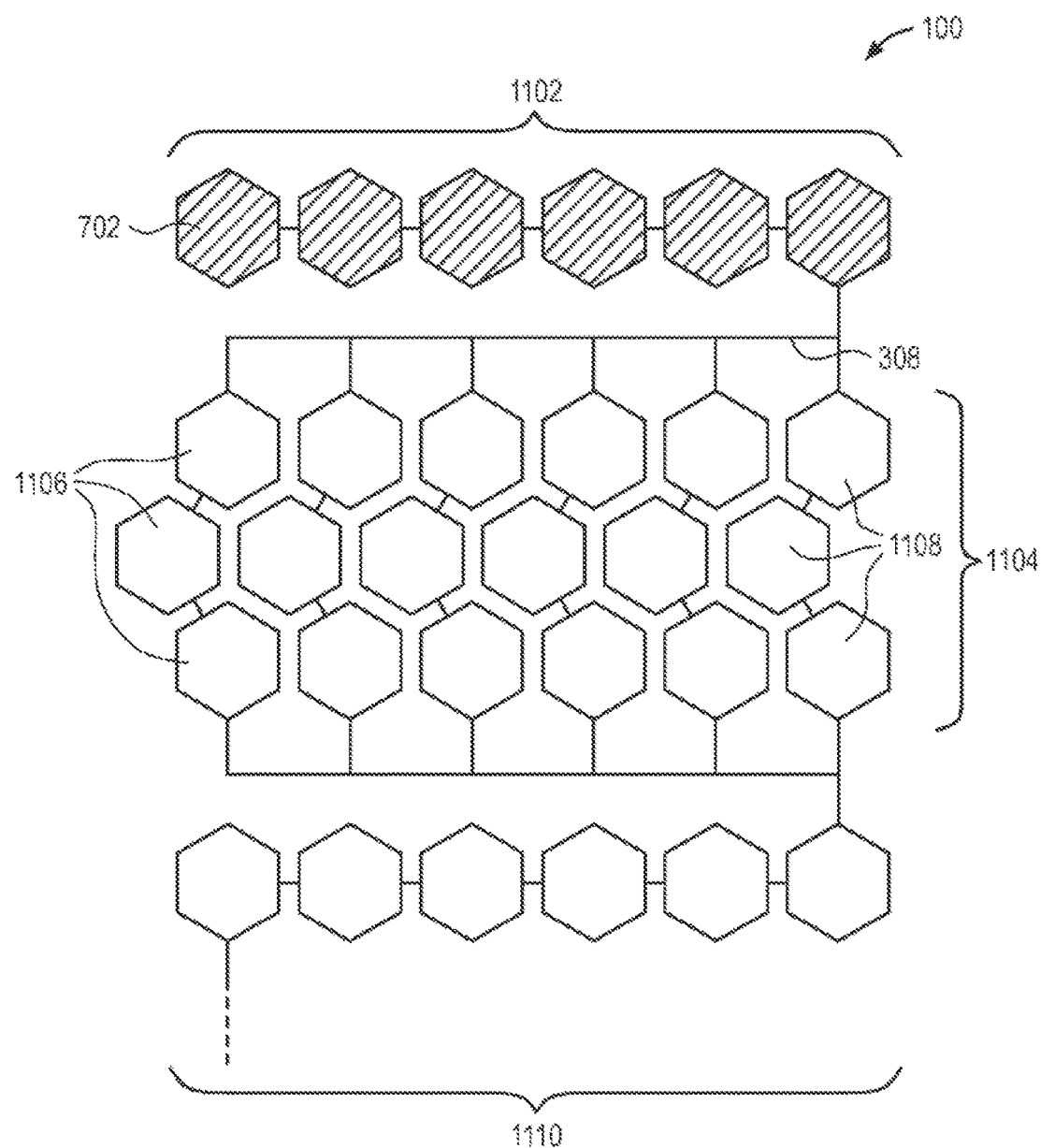
FIG. 11 is a schematic view of a photovoltaic module having a first set of photovoltaic cells electrically connected with a second set of photovoltaic cells.

Referring to FIG. 11, a schematic view of a photovoltaic module having a first set of photovoltaic cells electrically connected with a second set of photovoltaic cells is shown. Other types of interconnect architecture may be used, such as one or more of the embodiments described in U.S. Pat. No. 8,736,108. As described above, selective coloring of photovoltaic cells 102 may cause reflective loss in the range of light wavelengths that are reflected away from device layer 202. As an example, overall efficiency of photovoltaic cells colored in a manner as described above may result in a loss of energy conversion efficiency of up to about 20% as compared to a photovoltaic cell that incorporates a purely anti-reflective coating. To accommodate such power loss in individual photovoltaic cells 102, photovoltaic module 100 is advantageously electrically connected in a manner that allows for efficient overall harvesting of power from a plurality of differently colorized photovoltaic cells 102.

Photovoltaic module 100 includes a first set 1102 of one or more first photovoltaic cells 702 that are electrically connected in series with each other. For example, first set 1102 may include a plurality of first photovoltaic cells 702 that are each configured to have the same energy conversion efficiency. For example, each of first photovoltaic cells 702 may be configured to reflect the same color light in a direction, for example, red light, and therefore appear to have the same color as described above. Alternatively, each of first photovoltaic cells 702 may be differently colored or have different film configurations, but may nonetheless have approximately the same power efficiency.

For example, a first photovoltaic cell 702 in the first set 1102 may appear as a first color and reflect light at a first bright fringe for the first color, while a second photovoltaic cell 704 in the first set 1102 may appear as a second color and reflect light at a second bright fringe for the second color. Although the reflected colors may differ, the power loss for the different colors may be similar at the different selected bright fringes, and thus, differently colored photovoltaic cells 102 in the first set 1102 may have about the same conversion efficiency.

Although first set 1102 is shown with six photovoltaic cells in series, first set 1102 may include more or fewer photovoltaic cells. For example, first set 1102 may include between ten and twelve photovoltaic cells electrically connected in series. Typically, a series of photovoltaic cells are limited in efficiency by the least efficient cell in the series. However, since in this illustration every cell in first set 1102 includes the same configuration, for example, reflects the same wavelength of light, the power production efficiency of first set 1102 may not be significantly constrained by any one of the first photovoltaic cells 702 as compared to another.

Photovoltaic module 100 includes a second set 1104 of photovoltaic cells divided into subsets. For example, second set 1104 may include a first subset 1106 and a second subset 1108. As shown, second set 1104 may include six subsets. However, this is illustrative and more or fewer subsets may be included in second set 1104. Rather than being electrically connected in series, subsets of second set 1104 may be connected in parallel. For example, each subset may include one or more photovoltaic cells electrically connected in series, and the subsets may then be electrically connected in parallel. Consequentially, the efficiency of each subset will be limited by the least efficient photovoltaic cell in the subset. Nonetheless, the overall efficiency of second set 1104 may not be so limited. More particularly, voltage harvesting from each subset may be accumulated independently from parallel subsets, and thus, accumulation of voltage may not be limited by any one of the subsets. Optionally, each photovoltaic cell in a subset may be similarly configured, that is, may be similarly colored. However, similar coloring of sets may be unnecessary except to the degree it is necessary to achieve similar energy conversion efficiencies in the photovoltaic cells of first set 1102.

Photovoltaic module 100 may include numerous combinations of sets. For example, second set 1104 may be electrically connected in series with a third set 1110, which like first set 1102, may include a plurality of photovoltaic cells electrically connected in series. Furthermore, like first set 1102, the photovoltaic cells in third set 1110 may be similarly colored so as to not limit the efficiency of third set 1110 to a single low efficiency photovoltaic cell. Additional sets like second set 1104, in which subsets of serially connected photovoltaic cells are connected in parallel, may be added to build out photovoltaic module 100 further. Combinations of sets may be made in any manner, with sets connected in series, as shown, or with two or more sets of photovoltaic module 100 connected in parallel.

Figure 12:
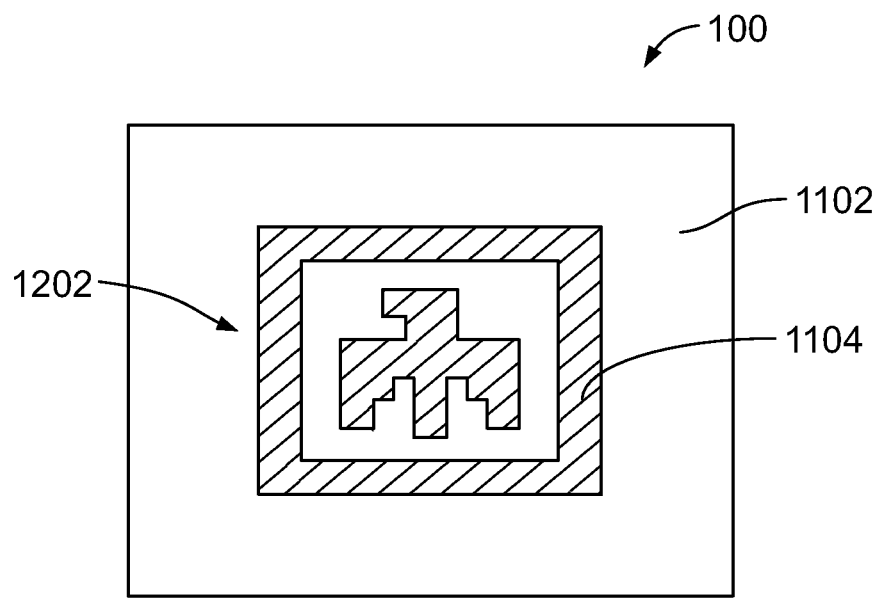
FIG. 12 is a pictorial view of a photovoltaic module having an image formed from a plurality of photovoltaic cells.

Referring to FIG. 12, a pictorial view of a photovoltaic module having an image formed from a plurality of photovoltaic cells is shown. Photovoltaic module 100 having a plurality of colorized photovoltaic cells 102 may be created such that reflections from the photovoltaic cells 102 visually combine to provide an image 1202. For example, photovoltaic cells 102 may essentially provide pixels of a displayed image 1202. In an embodiment, photovoltaic module 100 includes about 786,000 pixels arranged in a matrix fashion, such that an image resolution of 1024 times 768 may be achieved. Given that photovoltaic cells 102 may be individually formed and colored prior to being applied to receiving substrate 104, any size of image 1202 and/or resolution may be provided on photovoltaic module 100.

As an example, photovoltaic cells 102 may be arranged to display an image 1202, such as a company logo, on a photovoltaic module 100. First set 1102 of photovoltaic cells 102 may include a film that preferentially reflects a background color and second set 1104 of photovoltaic cells 102 may include a film that preferentially reflects a logo color. As described above, second set 1104 may also include some photovoltaic cell pixels of background color electrically connected in parallel with photovoltaic cell pixels of logo color. Thus, the combination of first set 1102 and second set 1104 in an arrangement will display a logo image 1202 to an onlooker. It will be readily apparent that although a photovoltaic module 100 that reflects a logo image 1202 may be less efficient than one with a purely anti-reflective coating, the aesthetic value provided by such a photovoltaic module 100 may offset the lower energy conversion efficiency. Furthermore, color customization of photovoltaic cells 102 may invite architects, industrial designers, and marketers to integrate microscale photovoltaic cells 102 into products that presently do not use commercial photovoltaic cells 102 because of their traditional size and appearance.

In addition to providing a logo image 1202 as shown in FIG. 12, images 1202 of varying complexities may be achieved through the individual manipulation of photovoltaic cell reflective properties and the combination of colorized photovoltaic cells into an arrangement on a photovoltaic module 100. More particularly, by treating each photovoltaic cell as a pixel, additive color models may be employed to combine different color lights into a wide range of colors. Those additive color models may be implemented in a single photovoltaic cell design or achieved by combining photovoltaic cells reflections.

Additive color models may be realized through the use of multi-layered films. More specifically, multiple film layers may be tuned to cause constructive interference and reflection of multiple light wavelengths. For example, in the case of a photovoltaic cell 102 having a two-layered film with a top film layer 404 and a bottom film layer 402, the top film layer 404 may be tuned to include an optical thickness of about 240 nm, that is, a half wavelength of blue light. Furthermore, the bottom film layer 402 may be tuned to include an optical thickness of about 110 nm, and thus, the combination of the upper layer and lower layer may create a total optical thickness for the film 204 of about 350 nm, that is, a half wavelength of red light. Accordingly, constructive interference and reflection may occur for both blue light and red light, and the reflected light rays may visually combine to give the photovoltaic cell 102 a magenta color.

Alternatively, photovoltaic cells 102 adjacently positioned that respectively reflect red, green, and blue may be manipulated to cause the combination of reflected light to be recognized as a combined color, such as red brown or forest green. Manipulation to achieve this effect may be made according to the principles described above. For example, the intensity of reflected red, green, and blue light from individual photovoltaic cells may be controlled by controlling film properties such that film ray 318 and cell ray 320 constructively interfere to a greater or lesser degree. Intensity of a color will be greatest where film ray 318 and cell ray 320 have no phase shift, but lower intensities may also be achieved by shifting film ray 318 and cell ray 320 out of phase slightly. Then, by reflecting different light and light intensities from adjacent cells, the individual colors from multiple photovoltaic cells 102 may visually combine into a resultant color when viewed by a distant onlooker.

Figure 13:
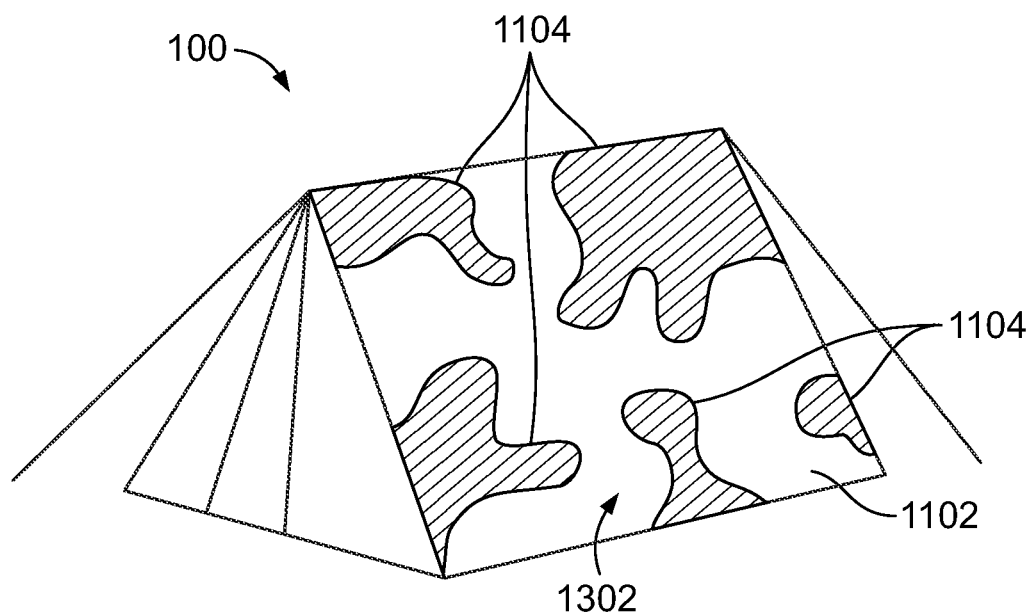
FIG. 13 is a pictorial view of an integrated photovoltaic module having an image formed from a plurality of photovoltaic cells.

Referring to FIG. 13, a pictorial view of an integrated photovoltaic module having an image formed from a plurality of photovoltaic cells is shown. In contrast with macroscale photovoltaic cells, miniaturized photovoltaic cells 102 can be fit within intricate shapes and contours of objects. Patterning and coloring of photovoltaic cells 102 placed on these objects may contribute to the overall design and function of the object. Photovoltaic module 100 may be applied over a flexible or curved surface to provide an aesthetic look and feel to an object. Given that photovoltaic module 100 may be formed with high flexibility, as described above, photovoltaic module 100 may conform to the movement and shape of the object that is to be visually modified. For example, photovoltaic module 100 may cover a curved surface, such as a helmet or parabolic reflector, or it may be adhered to a fabric substrate that flexes during use, such as clothing. As a further example, a tent may be covered by photovoltaic module 100 having first set 1102 of photovoltaic cells 102 of a first color and second set 1104 of photovoltaic cells 102 of a second color. The first color may be a red brown and the second color may be a forest green. Accordingly, when arranged in a particular pattern, the photovoltaic cells 102 may provide a camouflage pattern 1302 on the tent surface. It will be apparent that these implementations are non-limiting examples and that the integration of photovoltaic modules 100 as described above into product or structural form factors is virtually boundless.

FIG. 14 illustrates photovoltaic module 100 with image 1402. Image 1402 is formed using colorized reflective photovoltaic cells. Background areas 1404 may also be formed using colorized photovoltaic cells. It is also possible to form background 1404 using non-colorized photovoltaic cells. Non-colorized photovoltaic cells will tend to have a very dark or bluish black color due to their generally non-reflective properties.

FIG. 15 illustrates colorized photovoltaic cells from FIG. 14. Colorized photovoltaic cells 1502 visually combined to form image 1402. Each of the colorized photovoltaic cells 1502 may have different colors to help form the image. Colorized photovoltaic cells 1502 may have any shape; however, a square or hexagon shape may be desirable. Colorized photovoltaic cells 1502 may be of equal size or different size. The colorized photovoltaic cells may have a size of 100 μm×100 μm or roughly an area of 10,000 μm². In the case of photovoltaic cells being used as background 1404, it is possible to use a larger photovoltaic cell size since the high-resolution of the smaller pixel size cells may not be necessary for background. Notwithstanding that a background photovoltaic cell may be larger, the background photovoltaic cells may or may not be colorized. As discussed above, colorized photovoltaic cells may be colorized through the use of different film thicknesses or through the use of multilayer films.

FIG. 16 illustrates using colored sub-pixel reflective segments 1602 to form colorized photovoltaic cells 1502. Colorized photovoltaic cells 1502 are composed of a number of colored sub-pixel reflective segments. For example, 100 to 256 colored sub-pixel reflective segments may be used to form colorized photovoltaic cell 1502. It is also possible to use more colored sub-pixel reflective segments to form colorized photovoltaic cell 1502; for example 1,024 or 4,096 segments may be used. The color of colorized photovoltaic cell 1502 is determined by the visual combination of the colors of colored sub-pixel reflective segments 1602. The color of colored sub-pixel reflective segments 1502 may be selected by choosing from a set of base colors. For example, the base colors may be red, blue and green. It is also possible to add an additional color, such as a dark or near black as part of the set of base colors. Other base color sets such as cyan, magenta and yellow may be used. The advantage of using base colors is that colorized photovoltaic cell 1502 may be given almost any color using different combinations of different base color sub-pixel reflective segments. In the case where the set of base colors is limited to 3 or 4 colors, a standard set of 3 or 4 film thicknesses may be used to produce colored sub-pixel reflective segments which are then used to produce colorized photovoltaic cells of almost any color. For example a film thickness of approximately 140 nm will produce a red colored sub-pixel reflective segment, a film thickness of approximately 390 nm will produce a green colored sub-pixel reflective segment, a film thickness of approximately 90 nm will produce a blue colored sub-pixel reflective segment, and a film thickness of approximately 60 nm will produce a black or dark colored sub-pixel reflective segment.

It is also possible to use other colors as base colors, for example Cyan, Magenta, Yellow and Black may also be used as a set of base colors. In this example a film thickness of approximately 110 nm will produce a Cyan colored sub-pixel reflective segment, a film thickness of approximately 310 nm will produce a Magenta colored sub-pixel reflective segment, a film thickness of approximately 140 nm will produce a Yellow colored sub-pixel reflective segment, and a film thickness of approximately 60 nm will produce a black or dark colored sub-pixel reflective segment.

It is helpful to think of the desired color for a colorized photovoltaic cell as a particular percentage of base colors such as red, green, blue and black. The percentages of R, G, B, BK (Red, Green, Blue, Black) can be used to decide how many colored sub-pixel reflective segments within a colorized photovoltaic cell should be given a particular base color in order to provide the colorized photovoltaic cell 1502 with the desired color. It should be noted that for some desired colors a percentage for a particular base color may be zero.

In the case of a colorized photovoltaic cell having 256 colored sub-pixel reflective segments, the following colors can be created using the combinations of R, G, B and BK colored sub-pixel reflective segments shown. Tan can be created using a combination of 53, 54, 47 and 102 colored sub-pixel reflective segments having the colors R, G, B and BK, respectively. Light olive green can be created using a combination of 35, 40, 36 and 145 colored sub-pixel reflective segments having the colors R, G, B and BK, respectively. Forest green can be created using a combination of 27, 33, 30 and 166 colored sub-pixel reflective segments having the colors R, G, B and BK, respectively.

The brightness or intensity of colorized photovoltaic cell 1502 may be controlled using colorized sub-pixel reflective segments 1602 having a dark color. It is also possible to use non-reflective sub-pixel segments to provide a dark color. Increasing the number of non-reflective sub-pixel segments or dark colored sub-pixel reflective segments composing colorized photovoltaic cell 1502 decreases the color intensity of the colorized photovoltaic cell.

FIG. 17 illustrates colorized photovoltaic cell 1502 and colored sub-pixel reflective segments 1602. The color of colorized photovoltaic cell 1502 is determined by the percentage of colored sub-pixel reflective segments associated with each base color. The colors of the colored sub-pixel reflective segments visually combine to produce the desired color and intensity of colorized photovoltaic cell 1502. It is desirable that the spatial distribution of the colors of the colored sub-pixel reflective segments is approximately uniform in both the X and Y direction. The colored sub-pixel reflective segments composing colorized photovoltaic cell 1502 may be any shape; however, a square or hexagon shaped may be desirable. Colorized photovoltaic cell 1502 may be composed of, for example approximately 100 to 256 colored sub-pixel reflective segments.

FIG. 17 illustrates an example where the color of colorized photovoltaic cell 1502 is based on approximately equal percentages of red colored sub-pixel reflective segments (R), green colored sub-pixel reflective segments (G) and blue colored sub-pixel reflective segments (B) forming colorized photovoltaic cell 1502. It should be noted that the spatial distribution of the R, G and B colored sub-pixels reflective segments is approximately uniform in both the X and Y direction. It is possible to decrease the intensity of colorized photovoltaic cell 1502 by uniformly distributing dark colored sub-pixel reflective segments within colorized photovoltaic cell 1502.

Figure 18:
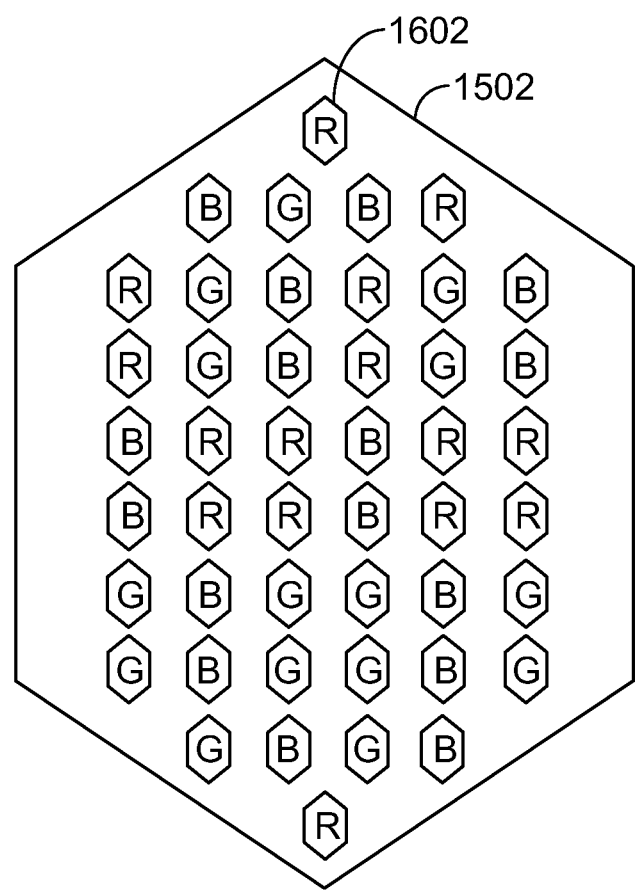
FIG. 18 illustrates a colored sub-pixel reflective segment spatial distribution.

FIG. 18 illustrates another example of where the color of colorized photovoltaic cell 1502 is based on approximately equal percentages of R, G and B colored sub-pixel reflective segments. It should be noted that the spatial distribution of the R, G and B colored sub-pixel reflective segment is approximately uniform in both the X and Y direction. It should also be noted that the spatial distributions of FIGS. 17 and 18, although approximately uniform, are not the same. Adjacent colorized photovoltaic cells may have the same color notwithstanding that they each have different spatial distributions of colored sub-pixel reflective segments. The adjacent cells appear to have the same color because they have the same combination or percentages of R, G and B colored sub-pixel reflective segments.

Figure 19:
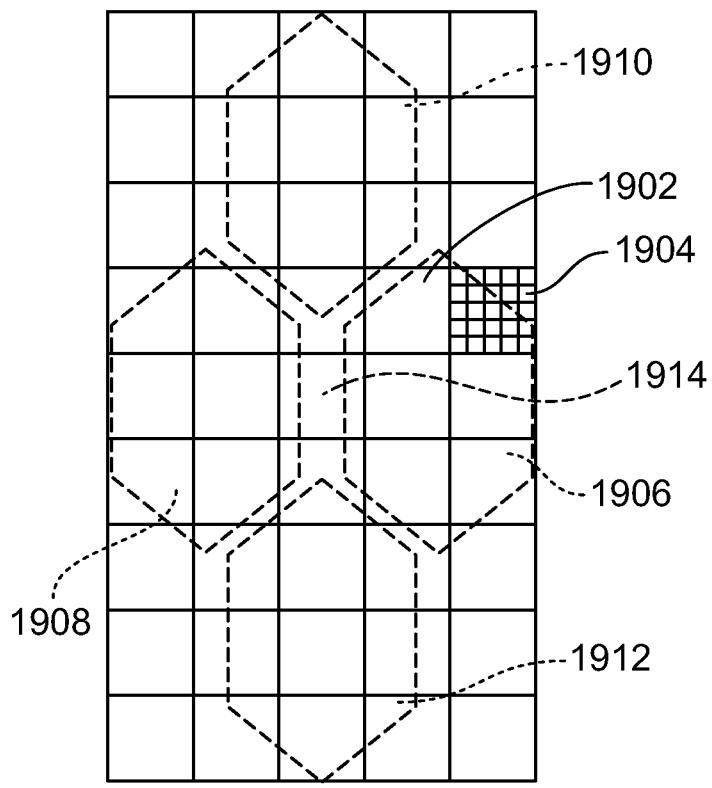
FIG. 19 illustrates reflective pixel segments.

FIG. 19 illustrates an embodiment where the film thicknesses providing color to the photovoltaic module is broken into reflective pixel segments 1902 which are composed of colored sub-pixel reflective segments 1904. Devices 1906, 1908, 1910 and 1912 convert energy from absorbed light to electricity using the photoelectric effect. It should be noted that the size of reflective pixel segments 1902 may be the same size, smaller or larger than the devices. In this illustration, reflective pixel segments 1902 are smaller than the devices and bridge device gaps 1914. For example, the reflective pixel segments 1902 may have dimensions such as 100 µm×100 µm.

Figure 20:
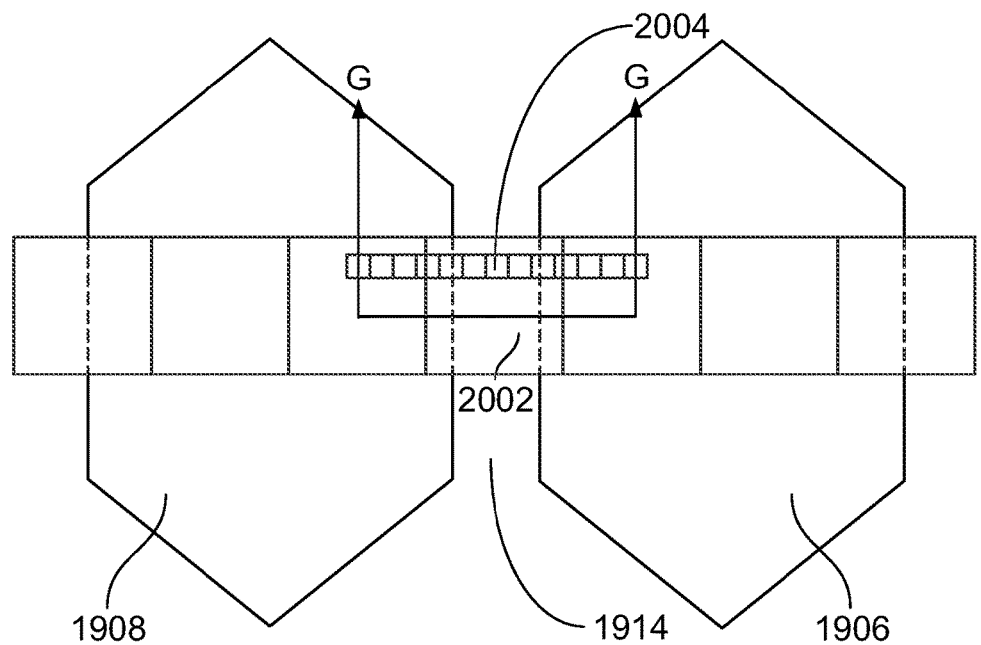
FIG. 20 illustrates adjacent devices with a reflective pixel segment bridging a device gap.

FIG. 20 illustrates devices 1906 and 1908, which are adjacent to each other with device gap 1914 between them. In this illustration reflective pixel segment 2002 bridges device gap 1914. This results in colored sub-pixel reflective segments 2004 being positioned over device gap 1914.

Figure 21:
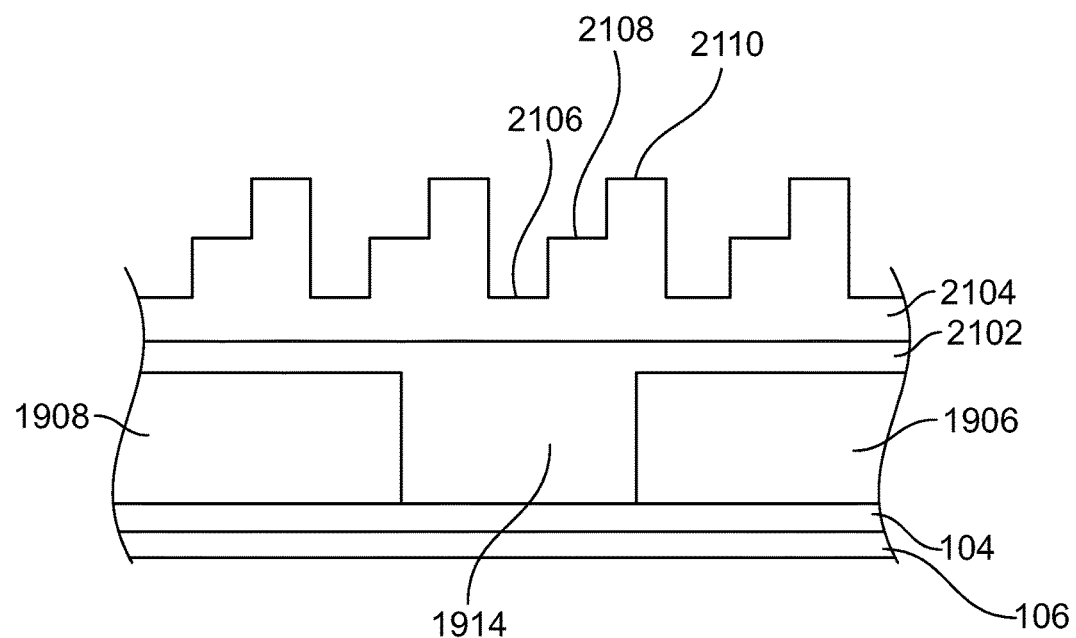
FIG. 21 illustrates a cross-section taken along lines G-G of FIG. 20.

FIG. 21 illustrates a cross-section taken along lines G-G of FIG. 20. Devices 1906 in 1908 are positioned above base substrate 106 and receiving substrate 104. Device gap 1914 is between devices 1906 and 1908. In order to improve the performance of devices 1906 and 1908, a coating of aluminum oxide ($Al_2O_3$) 2102 is often placed over devices 1906 and 1908 and also within device gap 1914. The portion of coating 2102 over devices 1906 and 1908 may have a thickness of approximately 10 nm to 30 nm. Positioned above aluminum oxide film 2102 is film 2104 which may be made using materials such as silicon dioxide ($SiO_2$) or silicon nitride ($Si_3N_4$). The thickness of film 2104 varies where each variation corresponds to a colored sub-pixel reflective segment. In this illustration, sub-pixel reflective segments 2106, 2108 and 2110 have different thicknesses and thereby reflect different colors. It should be noted that sub-pixel reflective segments 2106, 2108 and 2110 are over or partially over device gap 1914.

Figure 22:
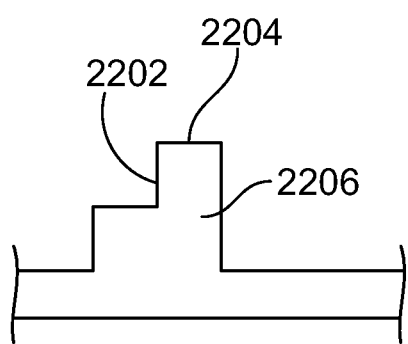
FIG. 22 illustrates transitioning between different film thicknesses.

FIG. 22 illustrates the transitioning between film thicknesses for adjacent sub-pixel reflective segments. In this illustration, transition 2202 between film thicknesses is discrete or nearly vertical. A near vertical transition is desirable; however, a transition within a distance of less than 1% of width 2204 of colored sub-pixel reflective segment 2206 may be used.

Figure 23:
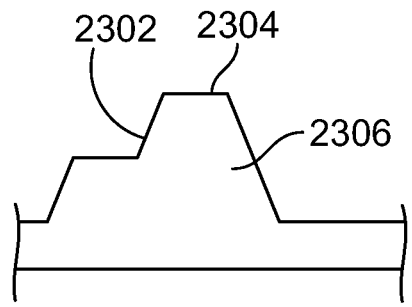
FIG. 23 illustrates a more gradual transitioning between different film thicknesses.

FIG. 23 illustrates the transitioning between film thicknesses of adjacent sub-pixel reflected elements where the transition is more gradual. In this example, transition 2302 occurs within a distance of less than 10% of width 2304 of colored sub-pixel reflective element 2306. Other transition profiles are possible; however, a sharper transition may be more desirable.

What is claimed is:

1. A photovoltaic module comprising
a plurality of photovoltaic cells arranged wherein reflections from the photovoltaic cells visually combine into an image;
a first colorized photovoltaic cell belonging to the plurality of photovoltaic cells, the first colorized photovoltaic cell having a first plurality of colored reflective segments that provide reflections that visually combine into a first predetermined color; and
a second colorized photovoltaic cell belonging to the plurality of photovoltaic cells, the second colorized photovoltaic cell having a second plurality of colored reflective segments that provide reflections that visually combine into a second predetermined color,
wherein each photovoltaic cell of the plurality of photovoltaic cells is an electricity generating device,
at least one film layer covers the plurality of photoelectric cells,
wherein the at least one film layer has a plurality of reflective pixel segments, said plurality including at least a first reflective pixel segment and a second reflective pixel segment,
each of the first and second reflective pixel segments has a plurality of colored sub-pixel reflective segments,
within the first reflective pixel segment, the colored sub-pixel reflective segments provide sub-pixel reflections that visually combine into the first predetermined color of the first colorized photovoltaic, cell, and
within the second reflective pixel segment, the colored sub-pixel reflective segments provide sub-pixel reflections that visually combine into the second predetermined color of the second colorized photovoltaic cell,
the reflective pixel segments provide pixel reflections, and the pixel reflections are the reflections from the photovoltaic cells that visually combine into an image.

2. The photovoltaic module of claim 1, wherein the first plurality of colored reflective segments reflect one of at least three colors, and wherein the second plurality of colored reflective segments reflect one of the at least three colors.

3. The photovoltaic module of claim 1, wherein the first predetermined color is controlled by a first color combination of colored reflective segments and the second predetermined color is controlled by a second color combination of colored reflective segments.

4. The photovoltaic module of claim 1, wherein a first brightness of the first predetermined color is controlled by a first number of colored reflective segments having a dark color, and a second brightness of the second predetermined color is controlled by a second number of colored reflective segments having a dark color.

5. The photovoltaic module of claim 1, further comprising a plurality of background photovoltaic cells.

6. The photovoltaic module of claim 1, wherein multiple film layers cover the electricity generating devices.

7. The photovoltaic module of claim 1, wherein at least one reflective pixel segment straddles two adjacent electricity generating devices.

8. The photovoltaic module of claim 7, wherein one colored sub-pixel reflective segment at least partially covers a gap between two adjacent electricity generating devices.

9. The photovoltaic module of claim 1, wherein at least two adjacent colored sub-pixel reflective segments have different film thicknesses.

10. The photovoltaic module of claim 9, wherein a transition in film thickness occurs over a distance being less than 1% of a width of a colored sub-pixel reflective segment.

11. The photovoltaic module of claim 9, wherein a transition in film thickness occurs over a distance less than 10% of a width of a colored sub-pixel reflective segment.

12. The photovoltaic module of claim 1, wherein the reflective pixel segments have a square shape.

13. The photovoltaic module of claim 1, wherein the colored sub-pixel reflective segments have a square shape.

14. The photovoltaic module of claim 1, comprising a first reflective pixel segment having a first plurality of colored sub-pixel reflective segments configured in a first combination of colored sub-pixel reflective segments and arranged in a first uniform distribution.

15. The photovoltaic module of claim 14, comprising a second reflective pixel segment having a second plurality of colored sub-pixel reflective segments configured in the first combination of colored sub-pixel reflective segments and arranged in a second uniform distribution.

16. The photovoltaic module of claim 15, wherein first and second reflective pixel segments are adjacent.

* * * * *